(12) United States Patent
Jan et al.

(10) Patent No.: US 6,511,609 B2
(45) Date of Patent: Jan. 28, 2003

(54) CU SEED LAYER DEPOSITION FOR ULSI METALIZATION

(75) Inventors: Ching-Han Jan, Hsinchu (TW); Fon-Shan Huang, Hsinchu (TW); Jih-Wen Wang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 77 days.

(21) Appl. No.: 09/785,170

(22) Filed: Feb. 20, 2001

(65) Prior Publication Data

US 2002/0113038 A1 Aug. 22, 2002

(51) Int. Cl.$^7$ .......................... H01L 21/00; B44C 1/22; C23F 1/00
(52) U.S. Cl. ........................ 216/87; 216/88; 216/99; 216/100; 438/692; 438/745; 438/754; 438/756
(58) Field of Search .................. 216/18, 39, 87, 216/88, 89, 99, 100; 438/691, 692, 693, 745, 754, 756

(56) References Cited

U.S. PATENT DOCUMENTS 6,211,090 B1 * 4/2001 Durlam et al. .......... 438/754 X
6,225,226 B1 * 5/2001 Lee et al. ................ 438/754 X

OTHER PUBLICATIONS

Ultralarge Scale Integrated Metallization and Interconnects, Christine Whitman, J. Vac. Sci. Technol. A 17(4), Jul./Aug. 1999; pp. 1893–1897.

Copper Electroplating For Advanced Interconnect Technology, Mikkola et al., Plate and Surface Finishing, Mar. 2000, pp. 81–85.

New Plating Bath for Electroless Copper Deposition on Sputtered Barrier Layers; Lantasov et al., Microelectronic Engineering 50 (2000), pp. 441–447.

Study on Selective Deposition of Cu Films on Si(100) Substrates at Ambient Pressure; Dr. Cheng–Tzu Kuo, Institute of Materials Science and Engineering National Chiao Tung University; pp. ii–iii.

Deposition of Copper Films on Silicon from Cupric Sulfate and Hydrofluoric Acid; Lee et al., J. Electrochem. Soc., vol. 144, No. 5, May 1997, pp. 1777–1780.

* cited by examiner

Primary Examiner—William A. Powell
(74) Attorney, Agent, or Firm—Bacon & Thomas, PLLC

(57) ABSTRACT

A novel method of Cu seed layer deposition for ULSI metalization is disclosed. The method of Cu seed layer deposition for ULSI metalization comprises forming a diffusion barrier on a substrate, forming a poly silicon layer, amorphous silicon layer or TaSix layer on said diffusion barrier, replacing said poly silicon layer with copper to form a copper seed layer, and electroplating a thick copper film on said copper seed layer. In this invention, a chemical replacing solution comprising a replacing reactant and at least one etchant is used to replace the poly silicon layer with copper and to reduce the quantity of byproducts of the reaction.

8 Claims, 6 Drawing Sheets

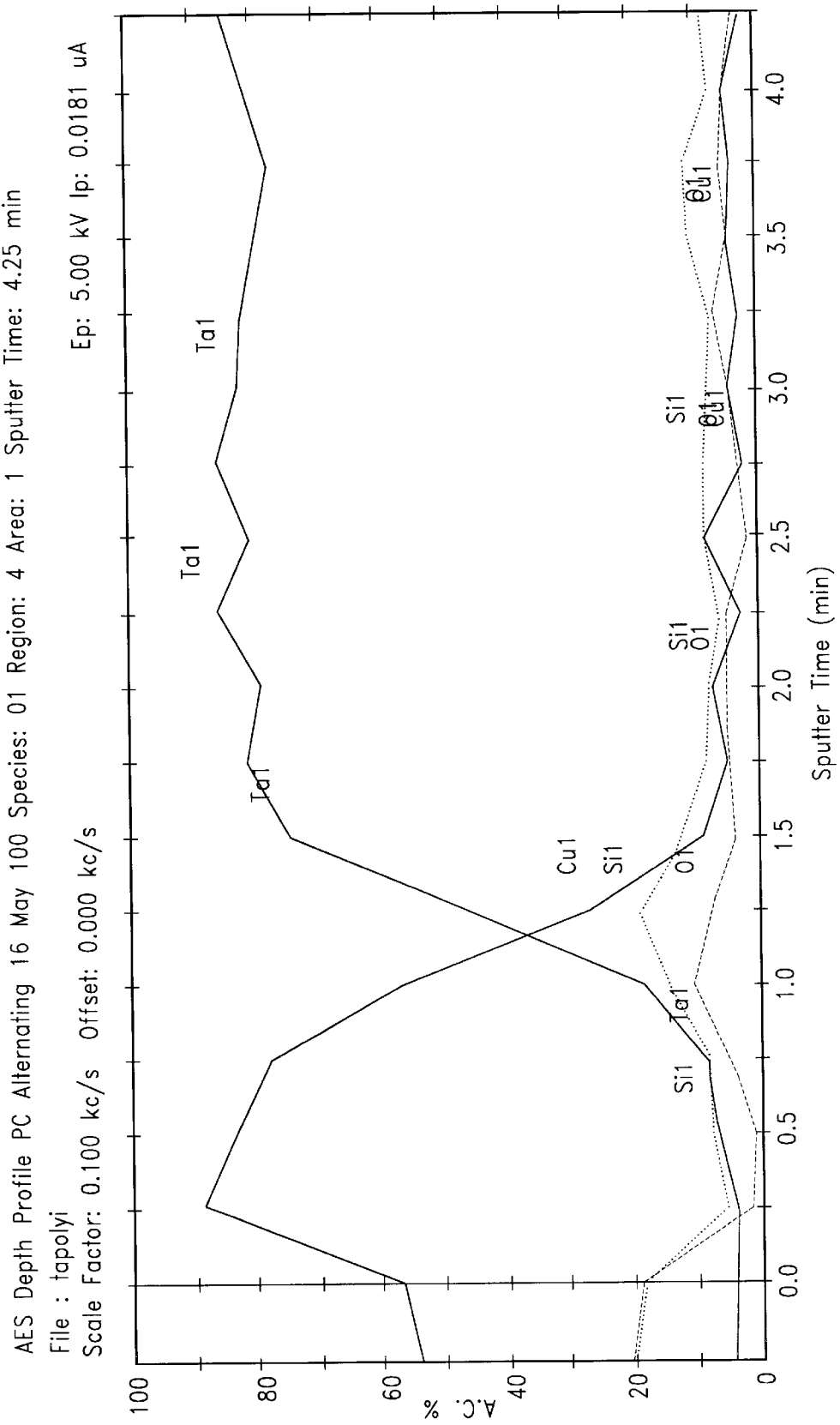

CU SEED LAYER DEPOSITION FOR ULSI METALIZATION

FIELD OF INVENTION

The present invention relates to a method for Cu seed layer deposition for ultra large scale intergration ULSI metalization, especially to a method for forming a Cu seed layer by replacing a poly silicon, amorphous silicon or TaSix layer in ULSI metalization.

BACKGROUND OF INVENTION

In the ULSI process, in order to reduce the RC delay time, it is necessary to form a Cu layer to replace Al. Due to the relatively low cost, the electric plating process of Cu layer is well accepted in the industry. In such a process, before a Cu layer is platted to the wafer, a seed layer is applied to the surface of the wafer to get good electrode surface, such that high quality of plating may be obtained. The seed layer is a thin Cu layer on the surface on which a metal layer will be platted. The seed layer may be deposited to the surface of the silicon dioxide or wafer. However, when vias with greater aspect ratio exist on the surface of the wafer, poor conformality in the physical vapor deposition (PVD) deposition of the seed layer will happen. As a result, the chemical vapor deposition (CVD) is used to solve such a problem.

Christine Whitman et al. suggested that the cluster MOCVD-Cu process is capable of depositing conformal and low-resistive copper seed layers with satisfactory adhesion for subsequent copper filing by either electrochemical deposition or MOCVD. (See Christine Whitman, Mehrdad M. Moslehi, Ajit Paranjpe, Lino Velo, and Tom Omstead, J. Vac. Sci. Technol. A 17(4), 1893, 1999) Although the CVD process is able to produce a qualified Cu seed layer, its high cost makes it impossible to reduce the manufacture cost of the ULSI preparation.

Robert Mikkola et al. disclosed a method for forming a Cu seed layer by PVD depositing a 1,000 Å Cu seed layer onto a 200 Å Ta adhesion layer. According to their experiments, when the thickness of the Cu layer is 1,000 Å at the side wall of the vias, it is possible to fill up vias with a diameter of 0.25 $\mu$m and an aspect ratio of 4. Resistivity of the as-deposit layer so prepared is 0.25 $\mu\Omega$-cm. After self-annealing for 40 hours under the room temperature or 20 minutes under 80° C., its resistivity may be reduced to 1.85 $\mu\Omega$-cm. (See R. D. Mikkola et al., "Copper electroplating for advanced interconnect technology", Plating and Surface Finishing, March 2000, P.81.) However, using this approach, the step coverage of the PVD film will be a problem for filling up vias with high aspect ratio.

Yuri Lantasov et al. disclosed a method of electroless electroplating copper to replace an activated Pd adhesion layer to form the seed layer. According to Lantasov et al., this approach is able to fill up vias on the wafer with a via diameter of 0.35 $\mu$m and an via aspect of 3. This approach, however, is not suited to wafers with vias of higher aspect ratio, since the Pd layer is sputtered on the surface of the wafers. (See Yuri Lantasov et al., "New plating bath for electroless copper deposition on sputtered barrier layers", Microelectronic Engineering, 50, 2000, p. 441.)

M. J. Shaw disclosed a method of directly depositing a copper film onto a silicon substrate with the photo-CVD technology under ambient pressure and under 240° C., by using Cu(hfac)$^2$ as reactant. (See M. C. Shiao, "Study on selective deposition of Cu films on Si (100) substrates at ambient pressure", National Chiao Tung University, MSECG, 1998, pt 1:2.) Under this approach, however, the resistivity of the copper film so prepared was 8.88 m$\Omega$-cm.

M. K. Lee et al. disclosed a method of chemical replacing silicon with copper directly to form a copper film under room temperature. When the thickness of the copper film is 5,000 Å, a low resistivity of 2.16 $\mu\Omega$-cm may be obtained. (See M. K. Lee et al., "Deposition of copper films on silicon for cupric sulfate and hydrofluoric acid", Journal of Electrochemical Society, Vol. 144, No. 5, May 1997.) In this paper, Lee et al. did not consider the existence of the diffusion barrier and the adhesion layer for Cu interconnection. As a result, a processing to suppress the diffusion of copper is needed.

It is thus necessary to provide a novel method of Cu seed layer deposition for ULSI metalization.

It is also necessary to provide a low-cost and simplified method of Cu seed layer deposition for ULSI metalization.

It is also necessary to provide a method of Cu seed layer deposition for ULSI metalization that is suited in substrates with vias of greater aspect ratio.

It is also necessary to provide a method of Cu seed layer deposition for ULSI metalization wherein problems brought by byproducts of reaction may be avoided.

OBJECTIVES OF INVENTION

The objective of this invention is to provide a novel method of Cu seed layer deposition for ULSI metalization.

Another object of this invention is to provide a low-cost and simplified method of Cu seed layer deposition for ULSI metalization.

Another object of this invention is to provide a method of Cu seed layer deposition for ULSI metalization that is suited in substrates with vias of greater aspect ratio.

Another object of this invention is to provide a method of Cu seed layer deposition for ULSI metalization wherein problems brought by byproducts of reaction may be avoided.

SUMMARY OF INVENTION

According to this invention, a novel method of Cu seed layer deposition for ULSI metalization is disclosed. The method of Cu seed layer deposition for ULSI metalization comprises forming a diffusion barrier on a substrate, forming a poly silicon layer, amorphous silicon layer or TaSix layer on said diffusion barrier, replacing the poly silicon layer, amorphous silicon layer or TaSix layer with copper to form a copper seed layer, and electroplating a thick copper film on said copper seed layer. In this invention, a chemical replacing solution comprising a replacing reactant and at least one etchant is used to replace the poly silicon layer, amorphous silicon layer or TaSix layer with copper and to reduce the quantity of byproducts of the reaction.

These and other objectives and advantages of this invention may be clearly understood from the detailed description by referring to the following drawings.

BRIEF DESCRIPTION OF DRAWINGS

FIG. 2 illustrates the Auger profile of a sample after a Cu seed layer is formed.

DETAILED DESCRIPTION OF INVENTION

Figure 1A:
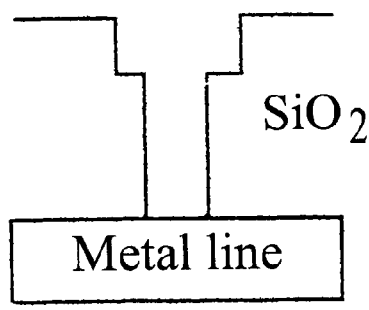
FIGS. 1a–d illustrates the flow chart of the method of Cu seed layer deposition for ULSI metalization of this invention.
Figure 1B:
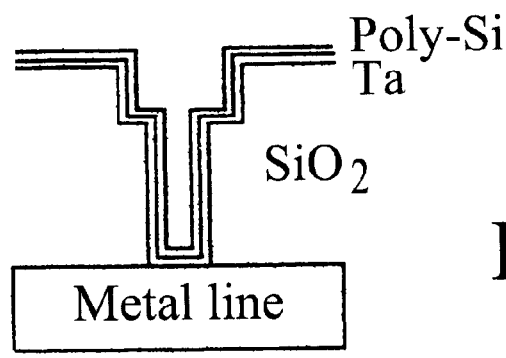
Figure 1C:
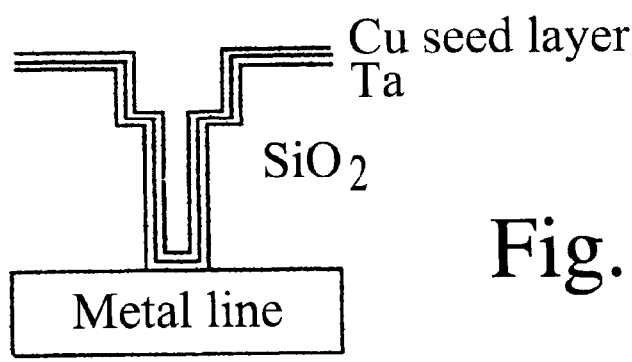
Figure 1D:
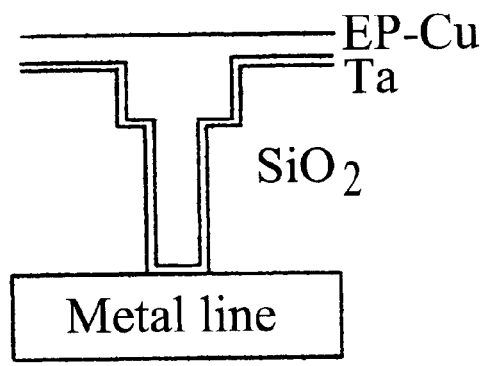

The following is a detailed description of the method of Cu seed layer deposition for ULSI metalization of this invention. The invented method may be used in a variety of ULSI metalization processes. In the following description, the application of this invention in the damascence technology will be taken for example, for illustration purposes. It is however understood that the scope of this invention is not limited to the application in the damascence technology.

FIG. 1 illustrates the flow chart of the method of Cu seed layer deposition for ULSI metalization of this invention. As shown, in step (a), a substrate with vias and trenches thereon is first prepared. Under the vias and the trenches are metal lines. Material of the substrate may be any dielectric material that is suited in the metalization process. Silicon dioxide is one of the most popular material for the substrate. Vias and trenches in the substrate may be prepared by chemical etching or other etching technologies. Of course, any other technologies that may form vias and trenches in the substrate may also be used. Method in the formation of the vias and the trenches may be decided according to the material of the substrate and the requirements in the preparation or in the application. Detailed descriptions of this step is thus omitted.

In Step (b), a barrier layer is formed on the substrate. Materials suited for the barrier layer include TiN, TaN and Ta. Thickness of the barrier layer may be approximately 500 Å. If material of the barrier layer is TiN, the barrier may be deposited onto the substrate with the LPCVD approach. If the material of the barrier layer is Ta, the barrier may be sputtered to the substrate or deposited to the substrate with the CVD approach. Of course, other technologies to form a diffusion layer on the substrate may also be suited in this invention.

Thereafter, a poly silicon layer is formed on the diffusion barrier layer. Suited processes include depositing a poly silicon layer onto the diffusion barrier layer in a LPCVD reactor under 590° C. and under 170 mtoor. Thickness of the poly silicon layer may be 650 Å. In another embodiment of this invention, an amorphous silicon layer is deposited on the surface of the diffusion barrier layer with the PECVD approach.

Later in Step (c), the product so prepared is sunk in a replacing solution. The replacing solution shall contain Cu ions such that the poly silicon layer may be replaced by copper. Suited reactants include $CuSO_4 \cdot 5H_2O$ and other reactant containing Cu ions.

The electrochemical reaction in replacing the poly silicon with copper is an oxidation-reduction (redox) reaction between silicon and copper, as follows:

At anode:

$$Si^0 + 6F^- \rightarrow SiF_6^{2-} + 4e^- \text{(Oxidation)}$$

At cathode:

$$2Cu^{2+} + 4e^- \rightarrow 2Cu^0 \text{ (metal reduction)}$$

Overall reaction:

$$Si^{0+} 2Cu^{2+} + 6F^- \rightarrow SiF_6^{2-} + 2Cu^0$$

In the above reactions, a subreaction may be:

$$Si^{4+} + 2O^{2-} \rightarrow SiO_2$$

Because the existence of the $SiO_2$ byproduct will damage the affixation of the copper to the wafer, an etchant is used to etch the $SiO_2$, such that the $SiO_2$ byproduct will not exist on the reaction interface and that successful replacement of the seed layer may be obtained.

As a result, a replacement solution comprising a reactant containing Cu ions and an etchant is recommended in this invention. Suited replacement solutions include a composition include a $CuSO_4 \cdot 5H_2O$ 1.5 g/L solution and an HF 7 cc/L solution.

In the redox reaction of this invention, the etching rate of the poly silicon is about 75 Å/min and the deposition rate of copper is about 155 Å/min. As a result, thickness of the poly silicon layer and concentration of the HF etchant shall be controlled, such that, after the replacement reaction, no residual poly silicon will remain on the surface of the diffusion barrier layer to damage the adhesion of the copper to the barrier layer.

After the reaction, a uniformed Cu seed layer may be deposited on the surface of the substrate. FIG. 2 shows the Auger profile of a sample after a Cu seed layer is formed according to this invention. As shown in this figure, almost no residual Si and $SiO_2$ are found in the interface.

Figure 3:
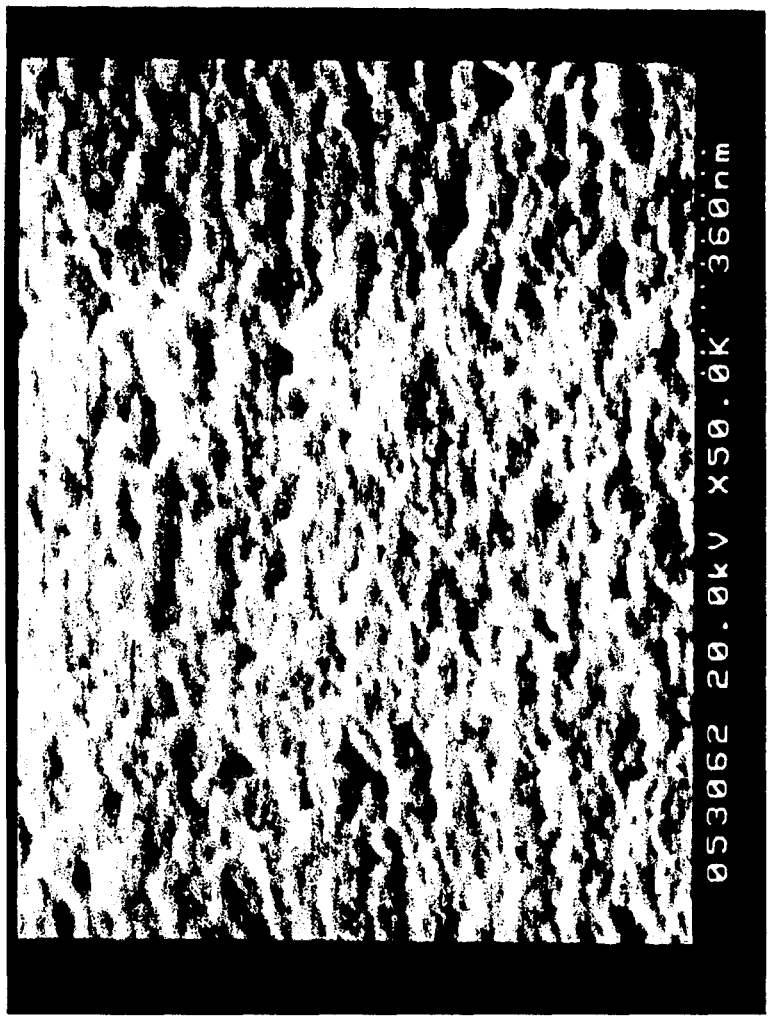
FIG. 3 illustrates the surface morphology of a Cu seed layer prepared according to this invention.

The resistivity of the Cu seed layer is measured and observed. The result show that its resitivity is 11.2 $\mu\Omega$-cm and the particle size on the surface is about 360 Å in average. FIG. 3 shows the SEM picture of the surface morphology of a Cu seed layer by replacing a poly Si on Ta structure.

In order to improve the affixation of the Cu layer to the diffusion barrier layer, the product is annealed under 350° C. in a nitrogen environment for 8 minutes, also in Step (c). Such annealing may further decrease the resistivity of the seed layer and make the Cu membrane structure ever dense.

Figure 4:
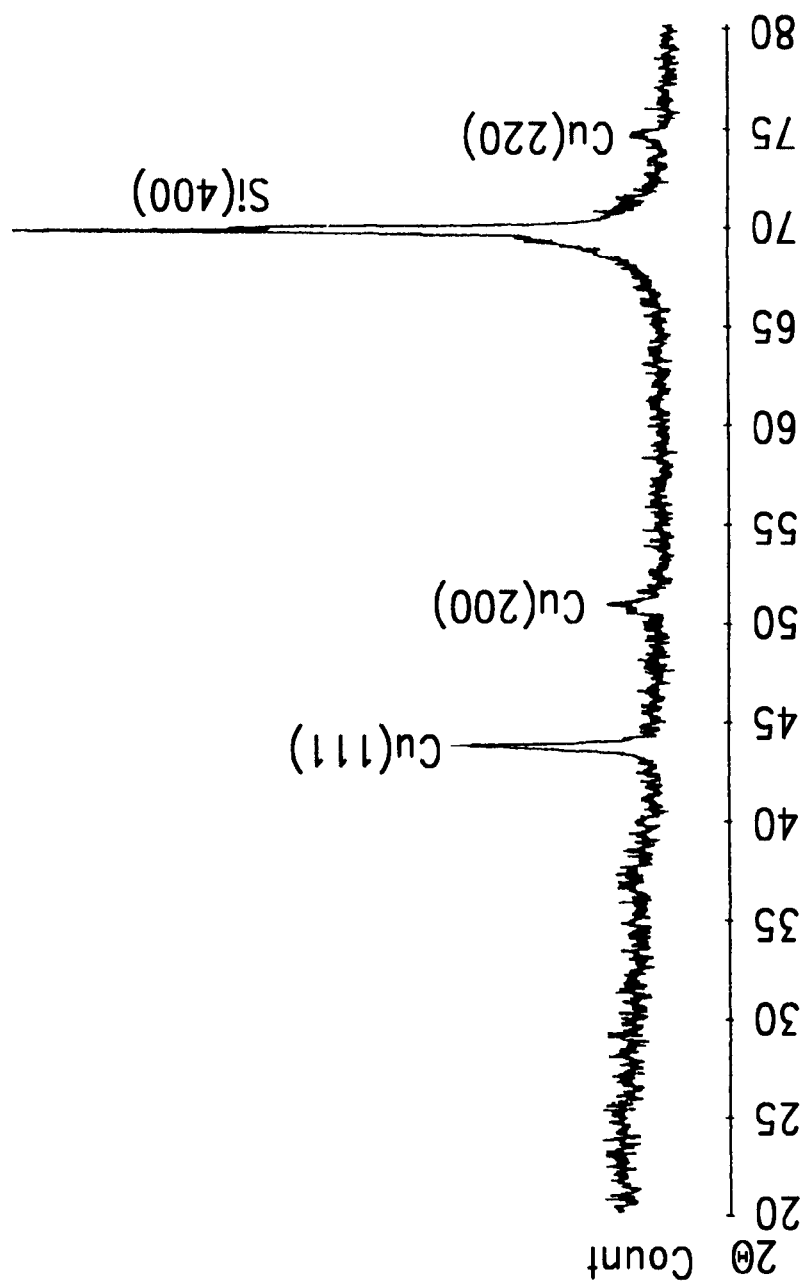
FIG. 4 illustrates the XRD of an electroplating Cu layer prepared according to this invention.

In Step (d) a metal is platted on the seed layer. Suited processes include electroplating a thick copper layer on the seed layer in an electroplating tank under 2.0ASD and under room temperature. The plating solution may consist of $CuSO_4 \cdot 5H_2O$(25 g/l), $H_2SO_4$(200 g/l), Hcl(0.15 ccA) and surfactants (5 cc/1). After 15 minutes, thickness of the copper membrane may be about 5,000 Å, with a resistivity of about 1.85 $\mu\Omega$-cm. The film is observed under an XRD the result is shown in FIG. 4. The result shows the existence of preferred texture with <111> component.

EFFECTS OF INVENTION

Figure 5:
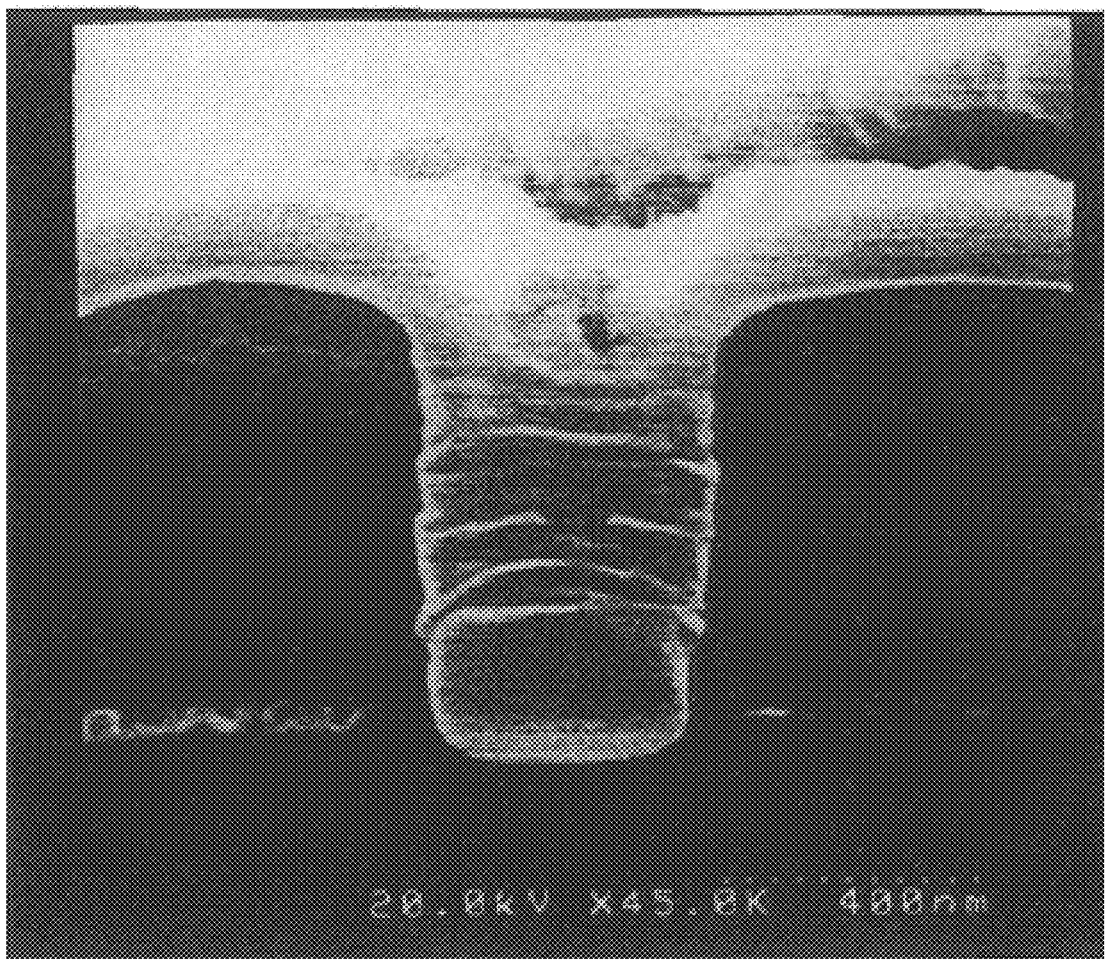
FIG. 5 illustrates the SEM cross sectional view of a Cu via-filling, prepared according to this invention.

The present invention employs the electrochemical replacement reaction to deposit the Cu seed layer. An improved step coverage may thus be achieved. After the electroplating process, vias with a diameter of 0.35 μm and an aspect ratio of 2 may be fully filled up. FIG. 5 illustrates the SEM cross sectional view of a substrate processed according to this invention. When the material of the diffusion barrier is Ta and the diffusion barrier is prepared by the CVD approach, the step coverage of the seed layer may be further improved and vias with even smaller diameter and greater aspect ratios may be filled by electroplated copper.

Figure 6:
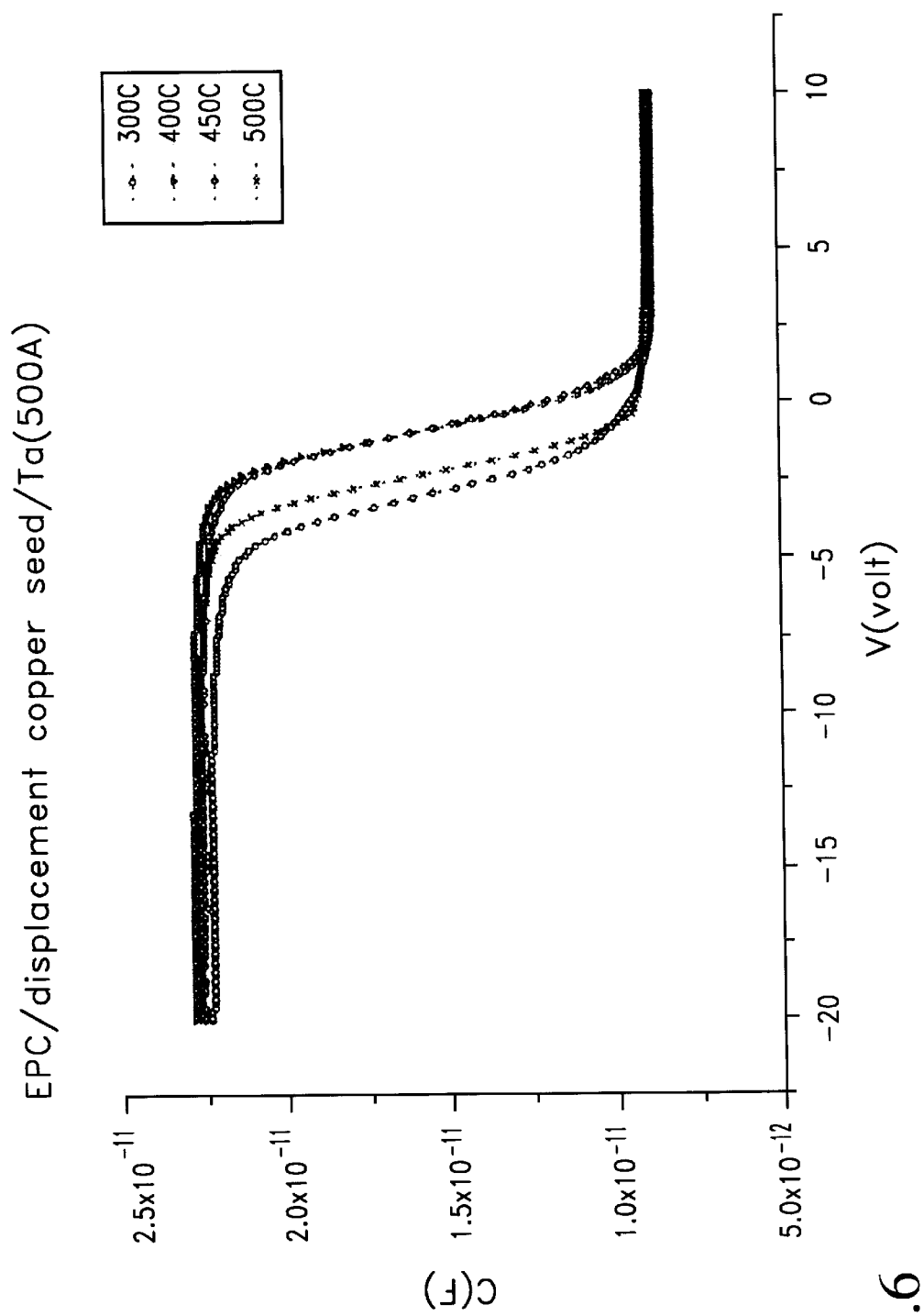
FIG. 6 illustrates the C-V characteristic curve of a sample, prepared according to this invention, after sintering at various temperature.

A MOS capacitor is prepared according to the method of this invention. Heat the capacitor to 300° C., 400° C., 450° C. and 500° C. respectively and measure its Vfb variation. The result shows that the copper layer platted on the seed layer so prepared provides excellent effects, with a stable temperature of 450° C. Products prepared according to this invention is suited as low dielectric/copper in the ULSI process. FIG. 6 shows the capacitance/voltage curve of a product prepared according to the present invention.

As the present invention has been shown and described with reference to preferred embodiments thereof, those skilled in the art will recognize that the above and other changes may be made therein without departing form the spirit and scope of the invention.

What is claimed is:

1. A method for depositing a copper seed layer on a substrate, comprising:

preparing a substrate;

applying a diffusion barrier layer on said substrate;

applying a replacement layer on said barrier layer; and replacing at least a part of said replacement layer with a thin copper film in a mixture containing a replacement reactant;

characterized in that said mixture comprises a chemical component providing active copper ions and at least one chemical component reducing a silicon oxidized.

2. The method according to claim 1 wherein said replacement layer comprises a poly silicon layer, amorphous silicon layer or TaSix layer.

3. The method according to claim 1 wherein said diffusion barrier layer comprises a TiN, Ta or TaN layer.

4. A method for depositing a copper seed layer on a substrate, comprising:

preparing a substrate;

applying a diffusion barrier layer on said substrate; and replacing at least a part of said diffusion barrier layer with a thin copper film in a mixture containing a replacement reactant;

characterized in that said mixture comprises a chemical component providing active copper ions and at least one chemical component reducing a silicon oxidized.

5. The method according to claim 4 wherein said diffusion barrier layer comprises a TaSix layer.

6. The method according to claim 1 or 4, wherein said substrate comprises a plurality of vias and trenches.

7. The method according to claim 1 or 4, wherein said mixture comprises $CuSO_4 \cdot 5H_2O$ and HF.

8. The method according to claim 1 or 4, further comprising a step to plat a copper layer on said thin copper film.

* * * * *